United States Patent [19]

Tanigawa

[11] Patent Number: 5,075,542

[45] Date of Patent: Dec. 24, 1991

[54] PHOTOELECTRIC SWITCH USING PULSE WIDTH DISCRIMINATION

[75] Inventor: Kiyoshi Tanigawa, Kanagawa, Japan

[73] Assignee: Fuji Electric Co., Ltd., Kanagawa, Japan

[21] Appl. No.: 519,141

[22] Filed: May 4, 1990

[30] Foreign Application Priority Data

Jul. 5, 1989 [JP] Japan .................................. 1-173425

[51] Int. Cl.$^5$ .............................................. G01V 9/04
[52] U.S. Cl. .................................. 250/221; 250/222.1
[58] Field of Search ............... 250/213 R, 213 A, 221, 250/222.1, 551; 307/311

[56] References Cited

U.S. PATENT DOCUMENTS

| | | | |
|---|---|---|---|
| 4,733,081 | 3/1988 | Mizukami | 250/221 |
| 4,929,825 | 5/1990 | Maeyama | 250/221 |
| 4,942,385 | 7/1990 | Kobayashi et al. | 250/221 |

*Primary Examiner*—David C. Nelms
*Assistant Examiner*—S. Allen
*Attorney, Agent, or Firm*—Finnegan, Henderson, Farabow, Garrett, and Dunner

[57] ABSTRACT

A photoelectric switch with a pulse width discrimination circuit ensuring that an object may be surely detected even when there are a plurality of adjacent photoelectric switches, and with an amplifier having a saturation characteristic preventing function ensuring that the pulse width is not changed when the input to the amplifier is large.

3 Claims, 3 Drawing Sheets

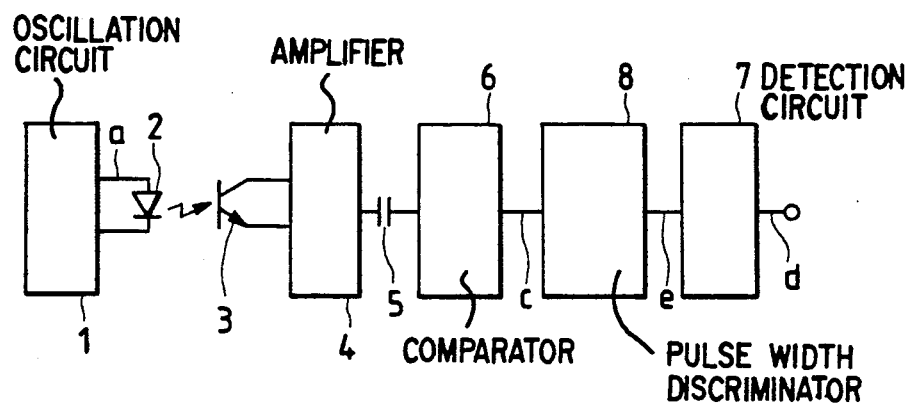
FIG. 1
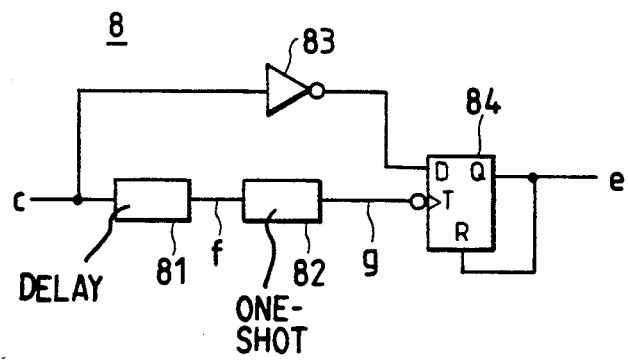
FIG. 2
FIG. 3(a)
FIG. 3(b)
FIG. 3(c)
FIG. 3(d)
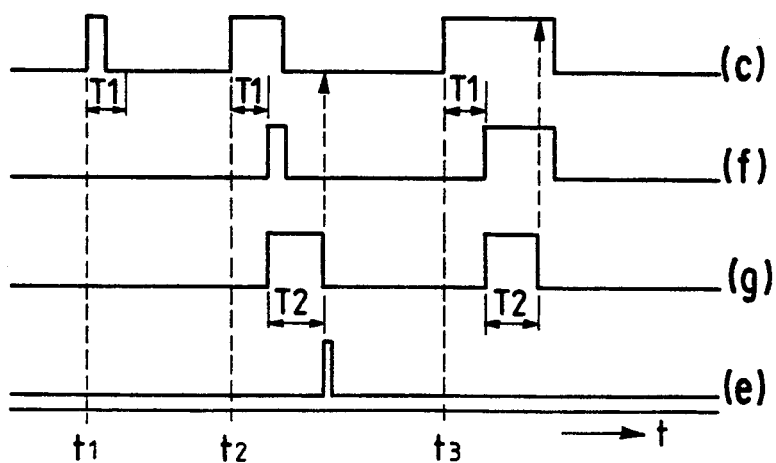

FIG. 6
PRIOR ART
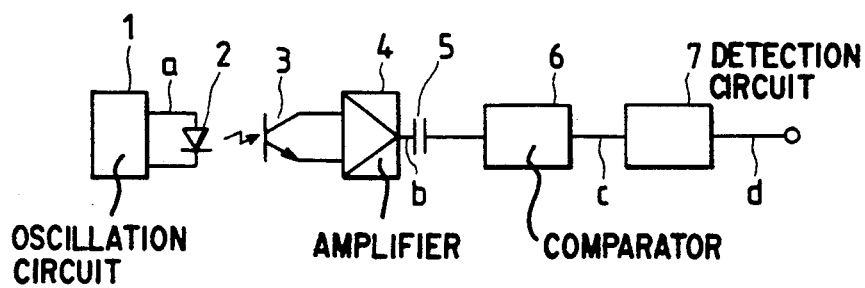
PRIOR ART
FIG. 7(a)
FIG. 7(b)
FIG. 7(c)
FIG. 7(d)
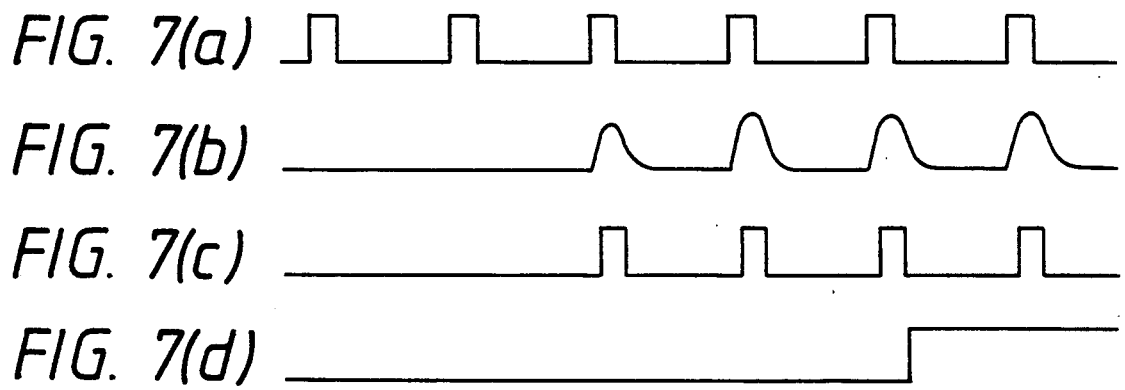
FIG. 8
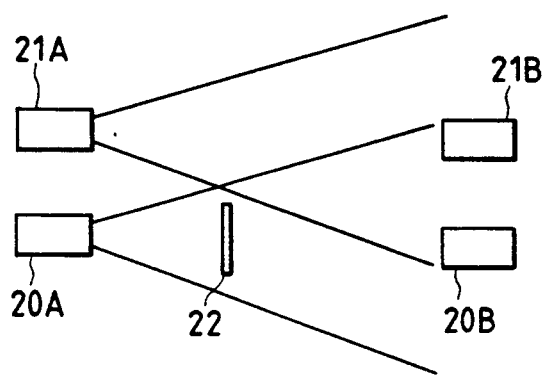

PHOTOELECTRIC SWITCH USING PULSE WIDTH DISCRIMINATION

FIELD OF THE INVENTION

The present invention relates to a photoelectric switch which is provided with a light emitting means for emitting a light pulse signal and a light detecting means for producing a light detection signal in response to the light pulse signal, so that the existence of an object between the light emitting and light detecting means can be detected.

BACKGROUND OF THE INVENTION

A photoelectric switch as shown in FIG. 6 is known. In FIG. 6, a light emitting means comprising an oscillation circuit 1 and a light emitting diode 2, connected to the output terminal of the oscillation circuit 1. A light detecting means, on the other hand, comprises an amplifier circuit 4, provided with a photo transistor 3, that receives a light pulse signal emitted from the light emitting diode 2 and converts the received light pulse signal into an electrical signal. Amplifier circuit 4 amplifies the signal and a capacitor 5 is connected between the output terminal of amplifier circuit 4 and the input terminal of a comparator 6. Detection circuit 7 is connected to the output terminal of comparator 6.

FIGS. 7(a)-(d) show waveforms at various portions of the photoelectric switch. The oscillation circuit 1 generates a pulse current as shown in FIG. 7(a) to actuate light emitting diode 2 to emit a light pulse signal. The amplifier circuit 4 receives the light pulse signal from light emitting diode 2 and converts it into an electrical signal by means of photo transistor 3, and then amplifies the electric signal to make it have a waveform as shown in FIG. 7(b). Capacitor 5 cuts a DC component of the amplified signal, and transfers the signal to comparator 6. The comparator 6 discriminates the signal applied thereto on the basis of a predetermined level to obtain a digital signal suitable for logical processing as shown in FIG. 7(c). Detection circuit 7 generates a detection signal as shown in FIG. 7(d) when the pulse output of comparator 6 is applied continuously a predetermined number of times.

The conventional photoelectric switch, however, has a problem in that, when a plurality of light emitting means 20A and 21A are arranged adjacent to each other, and a plurality of light detecting means 20B and 21B are arranged adjacent to each other, as shown in FIG. 8, light detecting means 20B receives a light signal from the light emitting means 21A, although a light signal from the light emitting means 20A is blocked off by an object 22 so that the light detecting means 20B cannot detect existence of the object 22. In an arrangement of a plurality of photoelectric switches, therefore, it is necessary to sufficiently separate the optical axes of the photoelectric switches from each other.

SUMMARY OF THE INVENTION

It is therefore an object of the present invention to solve the foregoing problem in the prior art.

It is another object of the present invention to provide a photoelectric switch by which an object can be surely detected without obstacles, even when there are a plurality of adjacent photoelectric switches.

In order to solve the problem, according to the present invention, the photoelectric switch comprises a light emitting element for emitting light in the form of a light pulse signal, a light detecting element for receiving the light pulse signal and for converting the light pulse signal into an electric signal, and an amplifier circuit for amplifying the electric signal to produce an amplified electric signal. The amplifier circuit is provided with a saturation-characteristic preventing function. A comparator is connected to the amplifier for discriminating the amplified electric signal on the basis of a predetermined level to convert the amplified electric signal into a digital pulse signal suitable for logical processing. A detection circuit produces a detection signal when the output pulse signal from the comparator is produced continuously a predetermined number of times. A pulse width discrimination circuit is connected between the comparator and the detection circuit for detecting whether a pulse width of the output pulse signal of the comparator is within a predetermined range, or not, to make the output pulse signal of the comparator valid when the pulse width is equal to a predetermined value.

The pulse width discrimination circuit discriminates the output pulse signal of the comparator so that only the pulse width of the light pulse signal emitted from the light emitting element is valid. A pulse signal having any pulse width other than the pulse width of the light pulse signal emitted from the light emitting element is not transmitted to the detection circuit. Further, since the amplifier circuit has a saturation-characteristic preventing function, the pulse width is not changed when the light pulse input into the amplifier circuit is large.

BRIEF DESCRIPTION OF THE DRAWINGS

The present invention will be better understood by reference to the accompanying drawings wherein:

FIG. 1 is a block diagram showing the photoelectric switch of an embodiment of the present invention;

FIG. 2 is a block diagram showing the pulse width discrimination circuit of the switch of FIG. 1;

FIGS. 3(a)-(d) are time charts explaining the operation of various portions of photoelectric switch of FIG. 1;

FIG. 6 is a block diagram showing a conventional photoelectric switch;

FIGS. 7(a)-(d) are time charts showing signal waveforms at various portions of FIG. 6;

FIG. 8 is a block diagram showing two sets of photoelectric switches provided adjacent to each other.

DETAILED DESCRIPTION OF THE PREFERRED EMBODIMENT

Figure 4:
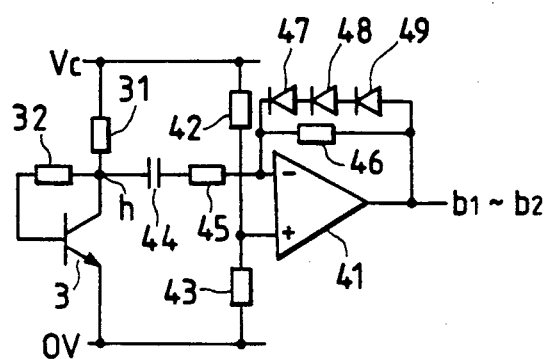
FIG. 4 is a circuit diagram of the amplifier circuit of the switch of FIG. 1.

FIGS. 1 through 4 show an embodiment of the photoelectric switch according to the present invention. In the drawings, elements corresponding to those of FIG. 6 are correspondingly referenced. In FIG. 1, an oscillation circuit 1, a light emission diode 2, a photo transistor 3, a capacitor 5, a comparator 6, and a detection circuit 7 are the same as those in the conventional photoelectric switch, and therefore further explanation of these elements is not necessary. The photoelectric switch according to the present invention is different from the conventional switch in that a pulse width discrimination circuit 8 is provided between the comparator 6 and the detection circuit 7, and an amplifier circuit 4 has a saturation-characteristic preventing function.

As shown in FIG. 2, in the pulse width discrimination circuit 8 a series circuit comprises a delay circuit 81 and a one-shot circuit 82 connected to the T input terminal of D-type flip-flop 84. An inversion circuit 83 is connected between the input terminal of the delay circuit 81 and the D input terminal of the flip-flop 84. The Q output terminal and the R input terminal of the flip-flop 84 are connected to each other, as shown in FIG. 2.

Referring to FIGS. 3(.ac)-(d), showing various waveforms, the operation of the pulse width discrimination circuit 8 will be described. FIG. 3(a) shows the waveform at the output of comparator 6, which is the input of the pulse width discrimination circuit 8. FIG. 3(b) shows the waveform at the output of the delay circuit 81, while FIG. 3(c) shows the waveform at the output of one-shot circuit 82. FIG. 3(d) shows the waveform at the output of flip-flop 84.

When the output pulse (c) of comparator 6 is applied to pulse width discrimination circuit 8, delay circuit 81 starts to operate. If the width of the output pulse (c) is shorter than predetermined time T1, as shown at time t1, the delay circuit 81 does not generate output (f). Since the width of output pulse (c) is longer than time T1 at time t2, one-shot circuit 82 is actuated to operate in response to output (f) of delay circuit 81, so that a pulse having a time width T2 is generated as output (g) of the one-shot circuit 82. Then, flip-flop 84 stores the output of inversion circuit 83 at the trailing edge of the output pulse (g) of the one-shot circuit 82. If the width of the output pulse (c) of the comparator 6 is longer than time T1+T2, as shown at time t3, the output of the inversion circuit 83 is "0", and therefore the "0" stored in the flip-flop 84 is left as it is. Consequently, the output of the pulse width discrimination circuit 8 does not change. That is, when the width of output pulse (c) of comparator 6 is within a range from time T1 to time T1+T2, the output of the inversion circuit 83 is "1" at the trailing edge of the output of the one-shot circuit 82, and therefore "1" is stored in the flip-flop 84. Then, the output of the flip-flop 84 becomes "1". The flip-flop 84 is therefore reset by its own output, so that the storage contents of the flip-flop 84 becomes "0" again.

The pulse width discrimination circuit 8 sends a pulse to detection circuit 7 when the output pulse width of comparator 6 is longer than time T1 and shorter than time T1+T2 as described above. The detection circuit 7 generates a detection output when the pulse applied thereto from the pulse width discrimination circuit 8 continues. In the case where the delay circuit is omitted, the pulse width discrimination circuit 8 only operates to make a pulse having a pulse width not longer than time T2 valid and to remove a pulse having a pulse width longer than the predetermined pulse width time T1.

In providing a pulse width discrimination circuit 8, however, there is a problem if a light detection signal is too large. Then, saturation in amplification occurs in the amplifier circuit 4 so that the pulse width changes and the pulse width discrimination circuit 8 performs the discrimination operation erroneously. Accordingly, amplifier circuit 4 is made to have a saturation-characteristic preventing function as shown in FIG. 4.

In FIG. 4, the amplifier circuit 4 is provided with photo transistor 3. A resistor 31, connected between the collector of the photo transistor 3 and a control power source Fc, and a resistor 32, connected across the collector and base of the photo transistor 3, act as bias resistors and constitute a light detecting circuit together with the photo transistor 3. In the amplifier circuit 4, the bias at the non-inversion input terminal of operational amplifier 41 is given by a series circuit comprising voltage dividing resistors 42 and 43 connected between a controlled power source Vc and a zero-volt level. The collector of the photo transistor 3 is connected to the inversion input terminal of the operational amplifier 41 through a series circuit comprising capacitor 44 and resistor 45.

Figure 5A:
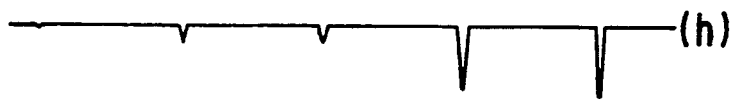
FIGS. 5(a)-(c) are time charts showing a comparison between the photoelectric switch according to the present invention and a conventional switch, showing pulses at various portions of each amplifier circuit.
Figure 5B:
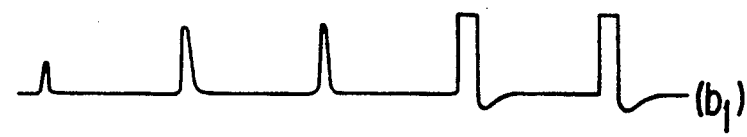

Conventionally, only a feedback resistor 46 has been connected between the output terminal and the inversion input terminal of the operational amplifier 41. Therefore, if a collector signal of photo transistor 3, as shown in FIG. 5(a), is applied to the operational amplifier 41, the output b1 of the operational amplifier 41 exceeds the operation range so that the operational amplifier 41 saturates. The width of output (b1) becomes longer than the width of a light detecting pulse, that is the width of the collector signal (h).

Figure 5C:

In this embodiment, therefore, a series circuit of three diodes 47, 48, and 49 is connected between the output terminal and the inversion input terminal of the operational amplifier 41. In this configuration, if the output of the operational amplifier 41 exceeds the forward voltage drop of the three diodes 47, 48, and 49, a current begins to flow into the diodes 47, 48, and 49. The the resistance value of the feedback resistor 46 is reduced which reduces the amplification factor of the operational amplifier 41 and thereby raises the output voltage of the operational amplifier 41. This prevents an increase in width of the output of the operational amplifier 41 as shown in FIG. 5(c). Accordingly, it is possible to accurately discriminate a pulse width independently of the intensity of a light detection signal.

As described above, according to the present invention, only a light detection signal having a predetermined pulse width is detected as a valid signal by the operation of the pulse width discrimination circuit. And, the amplifier circuit is made to have a saturation-characteristic preventing function. Therefore, even if another photoelectric switch is provided close to the photoelectric switch according to the present invention, occurrence of a maloperation due to reception of a light pulse signal emitted from the other photoelectric switch is prevented, if the emitted light pulse width of the other photoelectric switch is selected to be different from that of the first photoelectric switch. Further, maloperation due to a light pulse signal emitted from a fluorescent light or the like is also prevented.

Having described a preferred embodiment of the present invention, it is to be understood that various modifications and variations thereof may become apparent to those skilled in this art, and the scope of the present invention is to be determined by the appended claims and their equivalents.

What is claimed is:

1. A photoelectric switch comprising:
   a light emitting element for emitting light in the form of a light pulse signal;
   a light detecting element for receiving said light pulse signal emitted from said light emitting element and for converting said light pulse signal into an electric signal;
   an amplifier circuit for amplifying said electric signal to produce an amplified electric signal, said amplifier circuit being provided with a saturation-characteristic prevention function;

a comparator for discriminating sad amplified electric signal on the basis of a predetermined range so as to convert said amplified electric signal into a digital output pulse signal having a pulse width suitable for logical processing;

a detection circuit for producing a detection signal when said output pulse signal of said comparator is produced continuously a predetermined number of times; and a pulse width discrimination circuit, connected between said comparator and said detection circuit, for detecting whether said pulse width of sad output pulse signal of said comparator is within said predetermined range, for making said output pulse signal valid when said pulse width is in said predetermined range and then for outputting a signal to said detection circuit equal to a predetermined value.

2. The photoelectric switch of claim 1, wherein the pulse width discrimination circuit comprises:

a D type flip-flop with a D input, a T input, an R input and a Q output, where the R input and the Q output are connected;

a delay circuit with an input end and an output end;

a one-shot circuit with an input end connected to the output end of the delay circuit, and an output end connected to the T input of the D type flip-flop; and an inversion circuit with an input end connected to the input end of the delay circuit, and an output end connected to the D input of the D type flip-flop.

3. The photoelectric switch of claim 1, wherein the amplifier circuit comprises:

an operational amplifier with an output terminal and an inversion input terminal; and a series circuit of three diodes connected between the inversion input terminal and the output terminal of the operational amplifier.

* * * * *

UNITED STATES PATENT AND TRADEMARK OFFICE
CERTIFICATE OF CORRECTION

PATENT NO. : 5,075,542
DATED      : December 24, 1991
INVENTOR(S) : Kiyoshi TANIGAWA It is certified that error appears in the above-identified patent and that said Letters Patent is hereby corrected as shown below:

Column 5, claim 1, line 1, change "sad" to --said--.

Column 5, claim 1, line 12, change "sad" to --said--.

Signed and Sealed this

Eighth Day of June, 1993

Attest:

MICHAEL K. KIRK

Attesting Officer    Acting Commissioner of Patents and Trademarks